United States Patent
Chae et al.

(10) Patent No.: US 7,420,256 B2
(45) Date of Patent: Sep. 2, 2008

(54) NONVOLATILE SEMICONDUCTOR MEMORY DEVICE HAVING A GATE STACK AND METHOD OF MANUFACTURING THE SAME

(75) Inventors: Soo-doo Chae, Seongnam-si (KR); Chung-woo Kim, Seongnam-si (KR); Jung-hyun Lee, Yongin-si (KR); Moon-kyung Kim, Seoul (KR); Hyun-sang Hwang, Kwangju-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 367 days.

(21) Appl. No.: 10/835,097

(22) Filed: Apr. 30, 2004

(65) Prior Publication Data

US 2004/0264236 A1    Dec. 30, 2004

(30) Foreign Application Priority Data

Apr. 30, 2003    (KR) ...................... 10-2003-0027543

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)
*H01L 29/788* (2006.01)
*H01L 29/792* (2006.01)

(52) U.S. Cl. ........................ 257/411; 257/314; 257/315; 257/324; 257/406

(58) Field of Classification Search ......... 257/314–315, 257/324, 406, 411
See application file for complete search history.

(56) References Cited

U.S. PATENT DOCUMENTS 5,357,134 A * 10/1994 Shimoji ...................... 257/325

(Continued)

FOREIGN PATENT DOCUMENTS

DE    102 28 768    1/2003

(Continued)

OTHER PUBLICATIONS

Swift, et al. An Embedded 90nm Sonos Nonvolatile Memory Utilizing Hot Electron Programming and Uniform Tunnel Erase, Technical Digest of International Electron Device Meeting,. Dec. 2002 pp. 927-930.

(Continued)

*Primary Examiner*—Ida M Soward
(74) *Attorney, Agent, or Firm*—Lee & Morse, P.C.

(57) ABSTRACT

A nonvolatile semiconductor memory device includes a semiconductor substrate having a source region and a drain region, and a gate stack formed on the semiconductor substrate between and in contact with the source and drain regions. The gate stack includes, in sequential order from the substrate: a tunneling film; a first trapping material film doped with a first predetermined impurity, the first trapping material film having a higher dielectric constant than the nitride film ($Si_3N_4$); a first insulating film having a higher dielectric constant than a nitride film; and a gate electrode. Such a nonvolatile semiconductor memory device can effectively control the trap density according to the doping concentration, thereby increasing the write/erase speed of data at a low operating voltage.

34 Claims, 7 Drawing Sheets

U.S. PATENT DOCUMENTS

| | | | | |
|---|---|---|---|---|
| 5,768,192 | A * | 6/1998 | Eitan | 365/185.24 |
| 5,926,741 | A * | 7/1999 | Matsuoka et al. | 438/778 |
| 6,015,739 | A * | 1/2000 | Gardner et al. | 438/287 |
| 6,122,191 | A * | 9/2000 | Hirose et al. | 365/185.01 |
| 6,124,153 | A * | 9/2000 | Lee et al. | 438/151 |
| 6,146,946 | A * | 11/2000 | Wang et al. | 438/284 |
| 6,376,323 | B1 * | 4/2002 | Kim et al. | 438/373 |
| 6,407,435 | B1 * | 6/2002 | Ma et al. | 257/411 |
| 6,414,351 | B2 * | 7/2002 | Clampitt et al. | 257/315 |
| 6,417,570 | B1 * | 7/2002 | Ma et al. | 257/760 |
| 6,445,015 | B1 * | 9/2002 | Braddock | 257/192 |
| 6,586,792 | B2 * | 7/2003 | Ahn et al. | 257/295 |
| 6,621,114 | B1 * | 9/2003 | Kim et al. | 257/310 |
| 6,670,670 | B2 * | 12/2003 | Chae et al. | 257/316 |
| 6,696,332 | B2 * | 2/2004 | Visokay et al. | 438/216 |
| 6,727,134 | B1 * | 4/2004 | Chen et al. | 438/216 |
| 6,750,102 | B1 * | 6/2004 | Lancaster | 438/261 |
| 6,867,101 | B1 * | 3/2005 | Yu | 438/287 |
| 6,984,591 | B1 * | 1/2006 | Buchanan et al. | 438/778 |
| 2002/0067651 | A1 * | 6/2002 | Tsu-Jae | 365/226 |
| 2002/0089023 | A1 | 7/2002 | Gilbert et al. | |
| 2002/0115252 | A1 | 8/2002 | Haukka et al. | |
| 2002/0185674 | A1 * | 12/2002 | Kawashima et al. | 257/315 |
| 2002/0192910 | A1 * | 12/2002 | Ramsbey et al. | 438/257 |
| 2003/0011017 | A1 * | 1/2003 | Lee et al. | 257/314 |
| 2003/0015752 | A1 | 1/2003 | Palm et al. | |
| 2003/0025148 | A1 * | 2/2003 | Hsieh et al. | 257/315 |
| 2003/0042534 | A1 | 3/2003 | Bhattacharyya | |
| 2003/0047755 | A1 | 3/2003 | Lee et al. | |
| 2003/0089935 | A1 * | 5/2003 | Fan et al. | 257/296 |
| 2003/0155605 | A1 * | 8/2003 | Jong et al. | 257/314 |
| 2004/0032244 | A1 * | 2/2004 | Palm et al. | 324/71.5 |

FOREIGN PATENT DOCUMENTS

| | | |
|---|---|---|
| EP | 1 139 405 | 10/2001 |
| WO | WO 02/15276 | 2/2002 |

OTHER PUBLICATIONS

Lee, et al., * Extended Abstracts of the 2002 Intnl Conference on Solid State Devices & Materials **.
*Entitled: "A Novel Structure of SiO2/SiN/High k Dielectrics, Al2O3 for Sonos Type Flash Memory".
** Nagoya, pp. 162-163, (Sep. 2002).
Van Dover, "Amorphous lanthanide-doped TiOx dielectric films", Applied Physics.
Letters, vol. 74, No. 20, pp. 3041-3043, (May 17, 1999).

* cited by examiner

NONVOLATILE SEMICONDUCTOR MEMORY DEVICE HAVING A GATE STACK AND METHOD OF MANUFACTURING THE SAME

BACKGROUND OF THE INVENTION

1. Field of the Invention

The present invention relates to a semiconductor memory device. More particularly, the present invention relates to a nonvolatile semiconductor memory device having a gate with a different film structure from a silicon-oxide/nitride/oxide-silicon (SONOS), and a method of manufacturing the same.

2. Description of Related Art

Recent developments of portable data storage devices, such as memory sticks, that readily allow data sharing and exchange regardless of hardware type have led to increased demands regarding safe storage of large amounts of data. One possible solution is a flash memory device, i.e., a special type of an electrically erasable programmable read-only memory (EEPROM), which can be erased or programmed in blocks of data and the contents of which are retained even when the power is turned off. The flash memory device generally has a multi-layer structure including a floating gate, where a charge is stored, a transistor gate, where data are stored, and a control gate that controls the floating gate, the gates being sequentially deposited. However, the flash memory has a low retention characteristic and data stored therein cannot be kept safely for a long period of time due to a leakage current.

To solve this problem, a silicon-oxide/nitride/oxide-silicon (SONOS) memory device having a reduced height has been introduced. The SONOS memory device uses stacked layers between a substrate and a control gate. That is, instead of the floating gate positioned between insulating layers in the flash memory, the SONOS memory device uses a stacked layer made by sequentially depositing an oxide film, a nitride film, and another oxide film (ONO). The SONOS memory device operates by shifting a threshold voltage when a charge is trapped in the nitride film. A detailed description of a SONOS memory device is disclosed in an article entitled "An Embedded 90 nm SONOS Nonvolatile Memory Utilizing Hot Electron Programming and Uniform Tunnel Erase," by C. T. Swift et al., which was published in the Technical Digest of International Electron Device Meeting (IEDM) December 2002, pp. 927-930.

Figure 1:
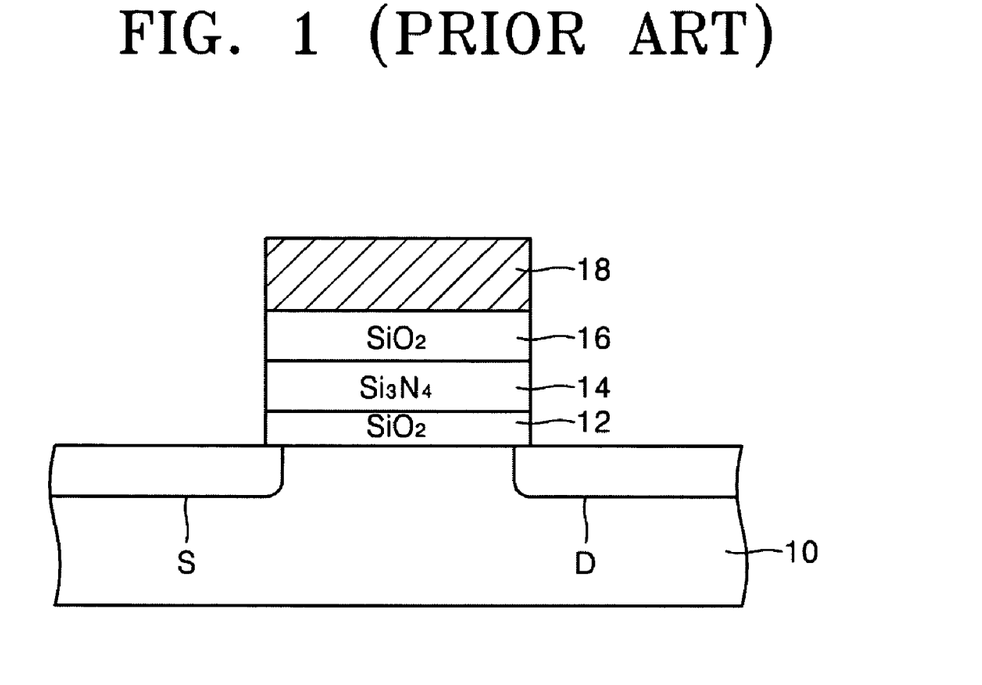
FIG. 1 illustrates a cross-section of a conventional SONOS memory device as an example of a conventional nonvolatile memory device.

FIG. 1 illustrates a cross-section of a basic structure of a conventional SONOS memory device.

Referring to FIG. 1, a first silicon oxide ($SiO_2$) film 12 is formed on a channel region between a source region S and drain region D of a substrate 10. One end of the first silicon oxide film 12 contacts the source region S and another end of the first silicon oxide film 12 contacts the drain region D. The first silicon oxide film 12 is for tunneling a charge. A nitride ($Si_3N_4$) film 14 is formed on the first silicon oxide film 12. The nitride film 14, which is practically a material film for storing data, traps the charge tunneled through the first silicon oxide film 12. A second silicon oxide film 16 is formed as a barrier film for blocking the movement of the charge from the nitride film 14 upward through the nitride film 14. A gate electrode 18 is formed on the second silicon oxide film 16.

Although the conventional SONOS device depicted in FIG. 1 provides some advantages, it also has the following drawbacks.

In practical use, an operating voltage of the conventional SONOS device is very high. If a low operating voltage is applied to the conventional SONOS device, the speed of writing/erasing of data becomes much slower than a desired speed. Due to such voltage dependence characteristic, the control of a trap density of the nitride film 14 also becomes difficult. The retention time also is not sufficiently long.

These drawbacks arise due to the high thickness of the films required by the use of nitride and silicon oxide, which have low dielectric constants.

Recently, a paper by C. Lee et al., entitled "Novel Structure of $SiO_2$/SiN/High-k dielectric, $Al_2O_3$ for a SONOS Type Flash Memory," published in Extended Abstract of 2002 International Conf. on Solid State Device and Materials, Nagoya, Japan, September 2002, pp. 162-163, reports that programming, erasing, and retention characteristic of the barrier film can be improved by using an aluminum oxide film ($Al_2O_3$) instead of an silicon oxide film as the upper oxide film. However, the applied voltage is still very high and it is still difficult to control the trap density of the silicon nitride film.

SUMMARY OF THE INVENTION

The present invention is therefore directed to a semiconductor memory device and method of manufacturing the same, which substantially overcomes one or more of the problems due to the limitations and disadvantages of the related art.

It is a feature of the present invention to provide a nonvolatile semiconductor memory device capable of operating satisfactorily at a voltage lower than the operating voltage of a SONOS memory device. It is another feature of the present invention to provide a nonvolatile semiconductor memory device capable of operating at a faster speed at the same voltage level as the SONOS memory device. It is yet another feature of the present invention to provide a nonvolatile semiconductor memory device capable of effectively controlling a trap density of a trapping material layer. It is still another feature of the present invention to provide a method of fabricating the nonvolatile semiconductor memory device.

At least one of the above and other features and advantages may be realized by providing a nonvolatile semiconductor memory device, including a semiconductor substrate having a source region and a drain region separated by a predetermined distance, and a gate stack formed on the semiconductor substrate, one end of the gate stack contacting the source region and another end of the gate stack contacting the drain region. The gate stack includes, in sequential order from the substrate, a tunneling film, a first trapping material film doped with a first predetermined impurity, the first trapping material film having a higher dielectric constant than a nitride film ($Si_3N_4$), a first insulating film having a higher dielectric constant than the nitride film, and a gate electrode.

The nonvolatile semiconductor memory device may further include at least one of a first oxide film between the tunneling film and the first trapping material film and a second oxide film between the first trapping material film and the first insulating film. At least one of the first oxide film and the second oxide film may be an aluminum oxide ($Al_2O_3$) film.

The first insulating film may be an aluminum oxide ($Al_2O_3$) film or may be selected from the group consisting of $HfO_2$ film, $ZrO_2$ film, $Ta_2O_5$ film, and $TiO_2$ film. The first predetermined impurity may be a lanthanide and may have a doping concentration of approximately 1~20%. The first trapping material film may be a film selected from the group consisting of $HfO_2$, $ZrO_2$, $Ta_2O_5$, $TiO_2$, and $Al_2O_3$.

The nonvolatile semiconductor memory device may further include a second trapping material film doped with a second predetermined impurity, the second trapping material film having a higher dielectric constant than the nitride film, and a second insulating film having a higher dielectric constant than the nitride film, the second trapping material film and the second insulating film being sequentially formed between the first insulating film and the gate electrode.

The nonvolatile semiconductor memory device may further include at least one, two or three, or all of a first oxide film between the tunneling film and the first trapping material film, a second oxide film between the first trapping material film and the first insulating film, a third oxide film between the first insulating film and the second trapping material film, and a fourth oxide film between the second trapping material film and the second insulating film. At least one of the first oxide film, the second oxide film, the third oxide film and the fourth oxide film may be an aluminum oxide film.

The second trapping material film may be formed of a material selected from the group consisting of $HfO_2$, $ZrO_2$, $Ta_2O_5$, $TiO_2$, and $Al_2O_3$. The second insulating film may be a film selected from the group consisting of $HfO_2$ film, $ZrO_2$ film, $Ta_2O_5$ film, $TiO_2$ film, and $Al_2O_3$ film. The first insulating film is a film selected from the group consisting of $HfO_2$ film, $ZrO_2$ film, $Ta_2O_5$ film, and $TiO_2$ film. The first predetermined impurity may be a lanthanide and may be at a doping concentration of approximately 1~20%. The second predetermined impurity may be a lanthanide and may be at a doping concentration of approximately 1-20%.

At least one of the above and other features and advantages may be realized by a method of manufacturing a nonvolatile semiconductor memory device, including forming a tunneling oxide film, forming a first trapping material film doped with a first predetermined impurity, the first trapping material film having a higher dielectric constant than that of a nitride film ($Si_3N_4$), forming a first insulating film having a higher dielectric constant than that of the nitride film, and forming a gate electrode, wherein the tunneling oxide film, the first trapping material film, the first insulating film, and the gate electrode are sequentially deposited on a semiconductor substrate. A gate region is defined on the gate electrode. A gate stack is formed by removing the gate electrode, the first insulating film, the first trapping material film, and the tunneling oxide film outside the gate region. A source and drain region are formed around the gate stack on the semiconductor substrate.

The method may further include forming an oxide film on at least one of the tunneling oxide film and the first trapping material film. The method may further include forming a second trapping material film doped with a second predetermined impurity and forming a second insulating film on the second trapping material film, the second trapping material film and a second insulating film being between the first insulating film and the gate electrode.

The method may further include forming an oxide film on at least one of the tunneling oxide, the first trapping material film, the first insulating layer and the second trapping material film. The first trapping material film may be a film selected from the group consisting of $HfO_2$ film, $ZrO_2$ film, $Ta_2O_5$ film, $TiO_2$ film and $Al_2O_3$ film. The first insulating film may be a film selected from the group consisting of $HfO_2$ film, $ZrO_2$ film, $Ta_2O_5$ film, and $TiO_2$ film. The oxide film may be an aluminum oxide film. The second trapping material film may be a film selected from the group consisting of $HfO_2$ film, $ZrO_2$ film, $Ta_2O_5$ film, $TiO_2$ film, and $Al_2O_3$ film. The second insulating film may be a film selected from the group consisting of $HfO_2$ film, $ZrO_2$ film, $Ta_2O_5$ film, and $TiO_2$ film. The first predetermined impurity may be a lanthanide at a doping concentration of approximately 1~20%.

A nonvolatile memory device according to the present invention provides the capability of controlling trap density effectively according to the doping concentration. Accordingly, writing/erasing of data can be operated at a lower voltage than in the conventional art, thereby increasing the operating speed as compared to the conventional art.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2003-27543, filed on Apr. 30, 2003, in the Korean Intellectual Property Office, and entitled "Nonvolatile Semiconductor Memory Device Having Gate Stack Comprising OHA (Oxide-Hafnium Oxide-Aluminum Oxide) Film and Method of Forming the Same," is incorporated by reference herein in its entirety.

Hereinafter, a nonvolatile semiconductor memory device in accordance with embodiments of the present invention will be described more fully with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on"

another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

First Embodiment

Figure 2:
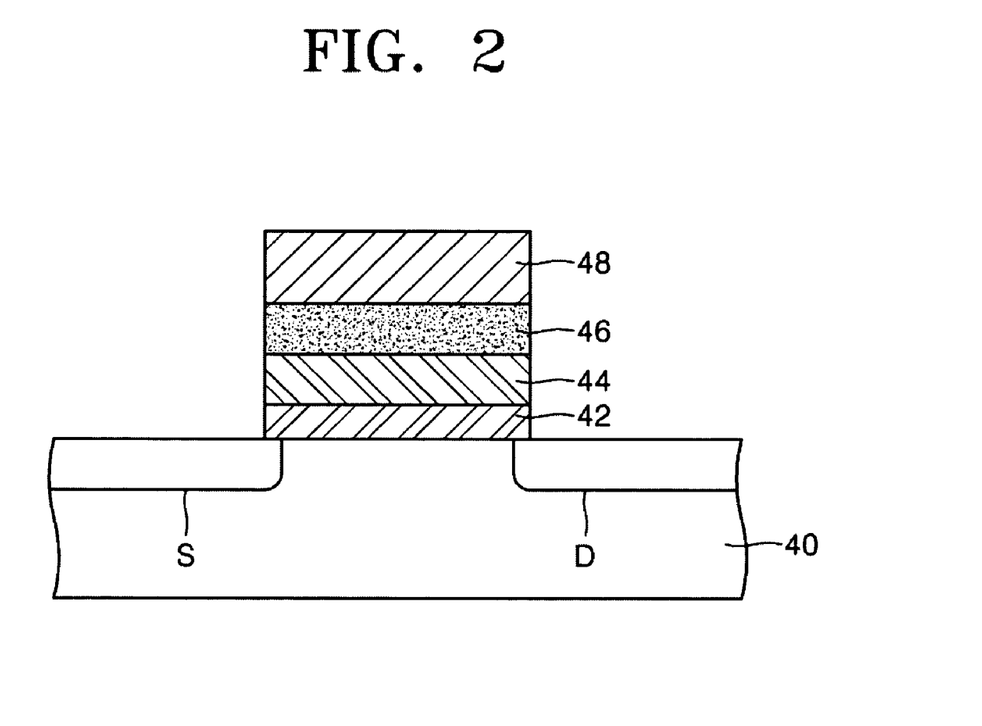
FIGS. 2 through 5 illustrate cross-sections of nonvolatile memory devices, according to first through fourth embodiments of the present invention.

Referring to FIG. 2, a source region S and drain region D are formed on a substrate 40 and separated by a predetermined distance. A space between the source region S and the drain region D on the substrate 10 defines a channel region. A gate stack is formed on the channel region. The gate stack is formed of the following layers deposited sequentially. First, a tunneling oxide film 42 is provided on the channel region. One end of the tunneling oxide film 42 contacts the source region S and another end of the tunneling oxide film 42 contacts the drain region D. A first trapping material layer 44 is formed on the tunneling oxide film 42. A first insulating film 46 having a high dielectric constant is formed on the first trapping material layer 44. Finally, a gate electrode 48 is formed on the first insulating film 46.

When a predetermined voltage is applied to the gate electrode 48 and the drain region D, the first trapping material film 44 traps a charge, i.e., electrons, which pass through the tunneling oxide film 42.

The tunneling oxide film 42 may be a silicon oxide film. The thickness of the tunneling oxide film 42 may be approximately 1.5~4 nm.

The first trapping material film 44 may be a non-nitride film or an insulating film doped with a predetermined impurity and having a high dielectric constant. The insulating film for the first trapping material film 44 may be an oxide film having a high dielectric constant selected from the group consisting of $HfO_2$, $ZrO_2$, $Ta_2O_5$, $TiO_2$, and $Al_2O_3$. When the first trapping material film 44 is an $HfO_2$ film, a thickness thereof may be approximately 2~15 nm. The dopant in the insulating film for the first trapping material film 44 may be a lanthanide, i.e., selected from the group consisting of La, Ce, Pr, Nd, Sm, Eu, Gd, Tb, Dy, Ho, Er, Tm, Yb, and Lu. When dysprosium (Dy) is used the dopant, a doping concentration may be approximately 1~20%, e.g., 10%.

Next, the first insulating film 46 which has a high dielectric constant is formed to prevent a portion of the electrons from moving through the first trapping material film 44 to the gate electrode 48 while the charge is being trapped by the first trapping material film 44. The first insulating film 46 may be formed of an aluminum oxide ($Al_2O_3$). Other materials having the same or a higher dielectric constant as aluminum oxide may be used for the first insulating film 46. The gate electrode 48 may be formed of a polysilicon electrode doped with a conductive impurity. Alternatively, other electrodes, such as a tungsten silicide electrode, may be used for the gate electrode 48.

Second Embodiment

Figure 3:
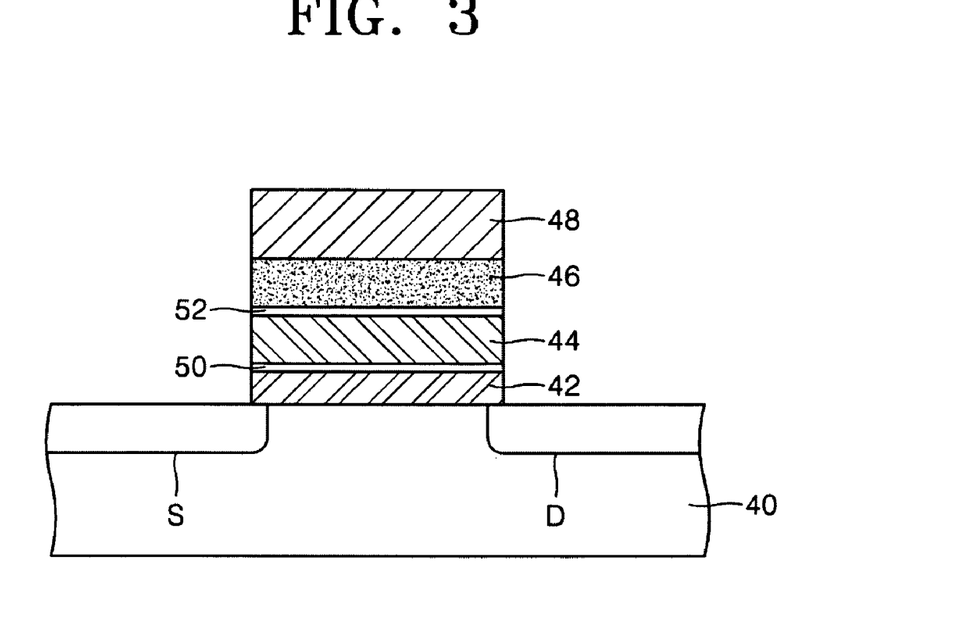

The second embodiment is related to a nonvolatile semiconductor memory device having a diffusion barrier layer on and under the first trapping material film 44.

In the following, the same reference numerals as in the first embodiment describe the same elements.

Referring to FIG. 3, a first oxide film 50, serving as a first diffusion barrier layer, is formed between the tunneling oxide film 42 and the first trapping material film 44. The first oxide film 50 may be an aluminum oxide film. The thickness of the tunneling oxide film 42 may be approximately 1~4 nm, and that of the first oxide film 50 may be approximately 0.5~2 nm. The phrase "tunneling film" as used herein is defined as the tunneling oxide film 42 in combination with the first oxide film 50.

A second oxide film 52, serving as a second diffusion barrier layer, is formed between the first trapping material film 44 and the first insulating film 46. The second oxide film 52 may be an aluminum oxide film, and the first insulating film 46 may be an insulating film having a high dielectric constant, for example, selected from the group consisting of $HfO_2$, $ZrO_2$, $Ta_2O_5$, and $TiO_2$. The thickness of the second oxide film 52 may be approximately 0.5~2 nm, and the thickness of the first insulating film 46 may be approximately 3~20 nm.

As compared with the first embodiment, the nonvolatile semiconductor memory device according to the second embodiment includes an oxide film formed between the first insulating film 46 and the gate electrode 48 and/or between the tunneling oxide film 42 and the first trapping material film 44. The first and second oxide films 50 and 52 may both be aluminum oxide films. However, any material that can act as a diffusion barrier layer can replace the first oxide film 50 and/or the second oxide film 52. Also, any material that can act as a diffusion barrier layer can replace other insulating films other than the oxide film.

Third Embodiment

Figure 4:
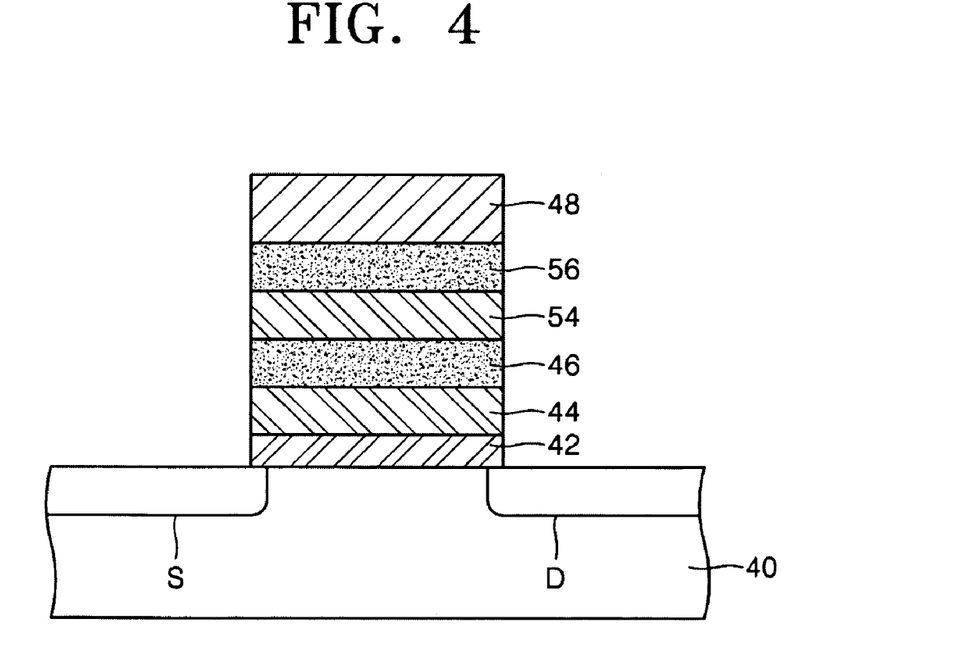

The third embodiment is related to a nonvolatile semiconductor memory device including a gate stack formed on a channel region of a substrate 40 and having a plurality of trapping material films.

Referring to FIG. 4, the first trapping material film 44 and the first insulating film 46 are formed on the tunneling oxide film 42. A second trapping material film 54 and a second insulating film 56 are sequentially deposited on the first insulating film 46. The gate electrode 48 is formed on the second insulating film 56. The second trapping material film 54 may be formed of an insulating film of doped lanthanide having a high dielectric constant, e.g., of the same material as that of the first trapping material film 44. Alternatively, the second trapping material film 54 may be formed of other insulating films. Likewise, the second insulating film 56 may be formed of the same insulating material film as the first insulating film 46. Alternatively, the second insulating film 56 may be formed of other insulating films. Also, the second trapping material film 54 and the second insulating film 56 have the same or a different thickness from the first trapping material film 44 and the first insulating film 46, respectively.

Fourth Embodiment

The fourth embodiment is related to a nonvolatile semiconductor memory device further including a diffusion barrier layer.

Figure 5:
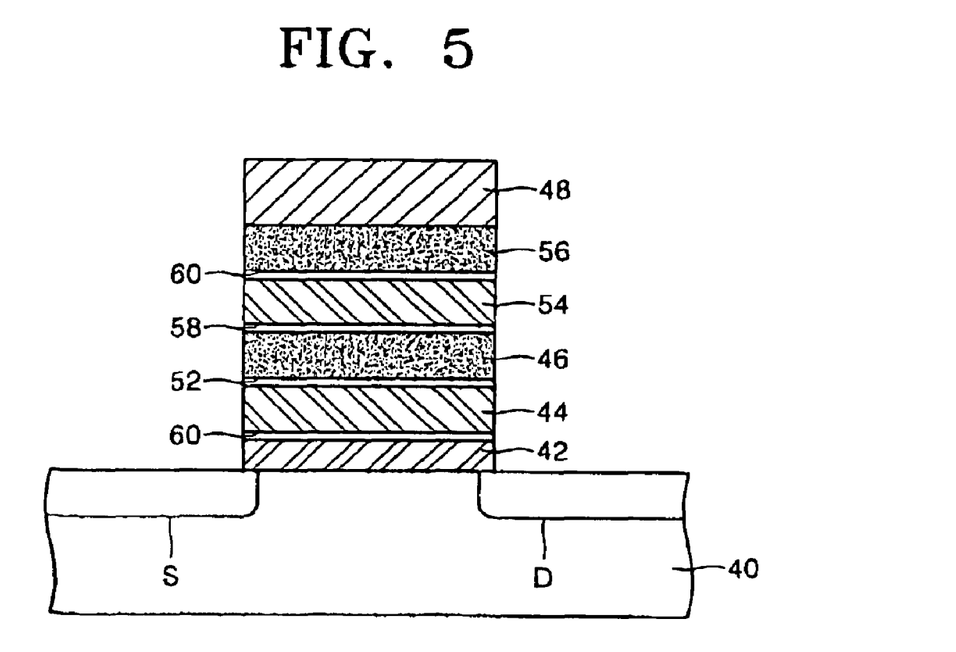

More specifically, as shown in FIG. 5, the first oxide film 50 is formed between the tunneling oxide film 42 and the first trapping material film 44. The second oxide film 52 is formed between the first trapping material film 44 and the first insulating film 46. A third oxide film 58 is formed between the first insulating film 46 and the second trapping material film 54. A fourth oxide film is formed between the second trapping material film 54 and the second insulating film 56. The third and the fourth oxide films 58 and 60 serve as diffusion barrier layers, as do the first and second oxide films 50 and 52. The third and the fourth oxide films 58 and 60 may be formed of aluminum oxide films, other oxide films or an insulating film.

According to the above descriptions, for a nonvolatile semiconductor device according the embodiments of the present invention, the first and second trapping material films 44 and 54 of the gate stack are formed of an insulating film having a high dielectric constant. For example, an $HfO_2$ film doped with a predetermined ratio of lanthanide, e.g., Dy, may be used.

In the following, the results of an experiment performed for verifying the characteristics of the nonvolatile semiconductor memory device according to the first embodiment of the present invention will be described.

Figure 6:
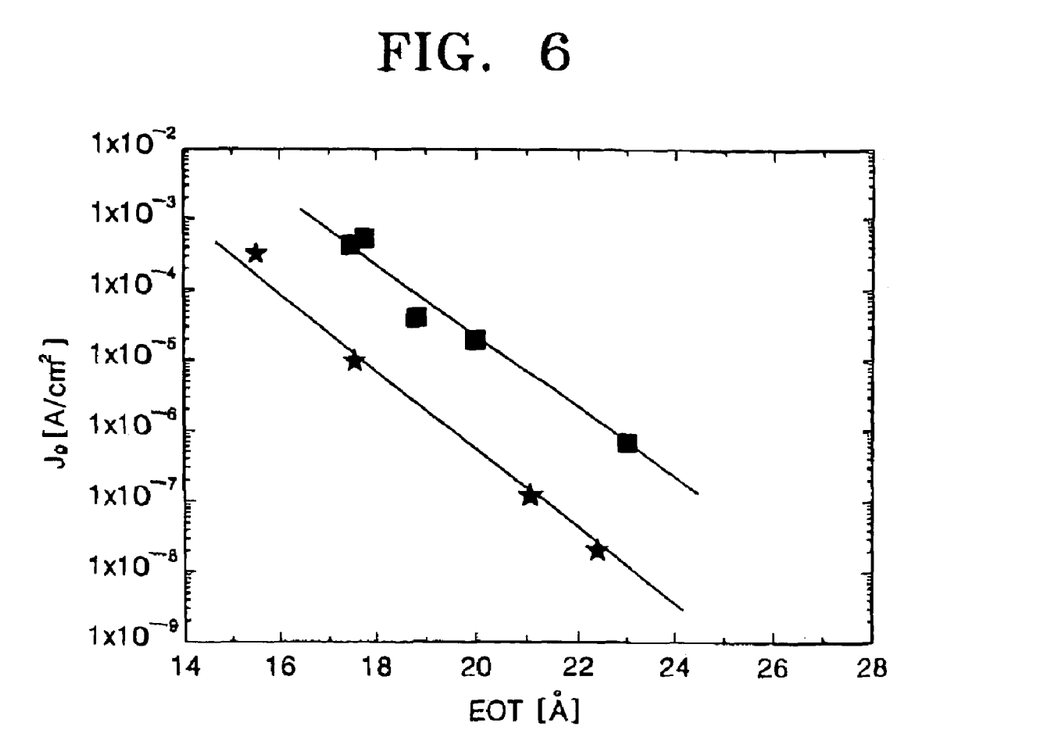
FIG. 6 is a graph showing the characteristics of a leakage current according to a doping concentration of an insulating film having a high dielectric constant, used for a nonvolatile memory device according to an embodiment of the present invention.

A leakage current density in two cases, that is, cases where the first trapping material film 44 is formed of $HfO_2$ film without doping (hereinafter, a first case) and with doping with a predetermined concentration of Dy (hereinafter, a second case), were measured.

FIG. 6 is a graph showing the results of the experiment. Symbol "■" refers to a variation of the leakage current density in the first case, and symbol "★" refers to that in the second case. Referring to FIG. 6, the leakage current density Jg ($A/cm^2$) in the second case is much lower than that in the first case at the same effective oxide thickness EOT (Å).

Figure 7:
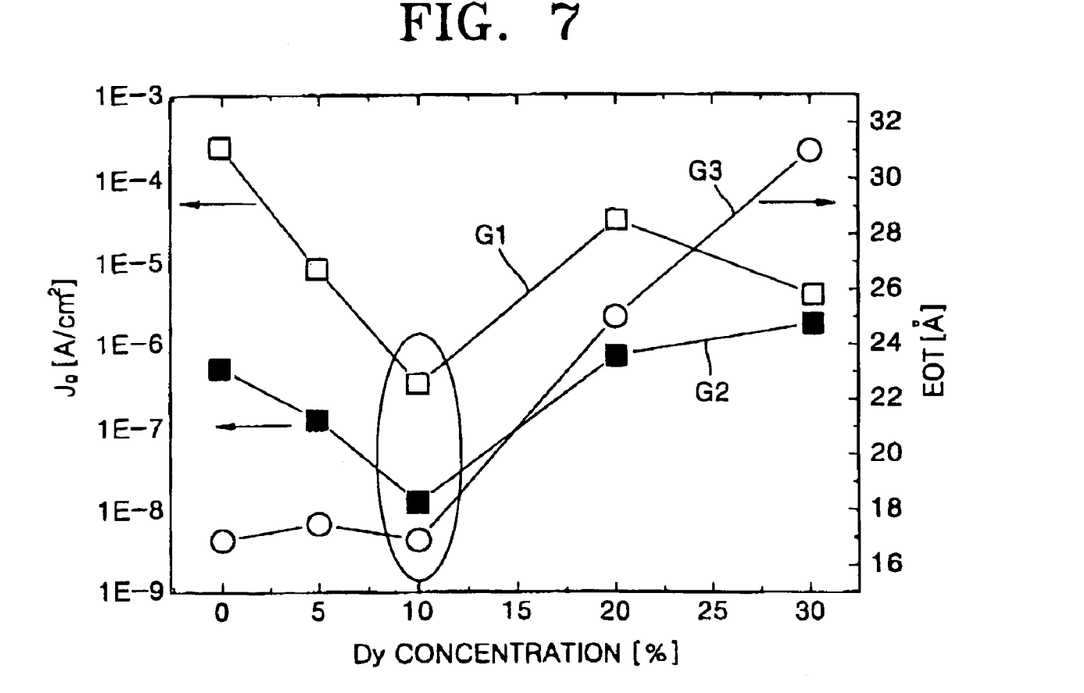
FIG. 7 is a graph showing a variation of a leakage current and an effective thickness according to a doping concentration of an insulating layer having a high conductivity, used for a nonvolatile memory device, according to an embodiment of the present invention.

FIG. 7 shows a variation of the leakage current density Jg and the effective oxide thickness EOT according to the Dy concentration (%) in the second case. The leakage current density (Jg) and the effective thickness were measured by Auger electron spectroscopy (AES). In FIG. 7, graph G1 with symbol □ shows the variation of the leakage current density when 2V of flat band voltage was applied, graph G2 with symbol "■" refers to the variation of the leakage current density when 1V of flat band voltage was applied, and graph G3 with symbol "○" refers to the variation of the effective thickness.

Referring to graphs G1-G3 in FIG. 7, a lowest leakage current density and the thinnest effective thickness are shown at the Dy concentration of approximately 10%. That is, when the Dy concentration is approximately 10%, the characteristics of leakage current and the effective thickness have optimum values.

Figure 8:
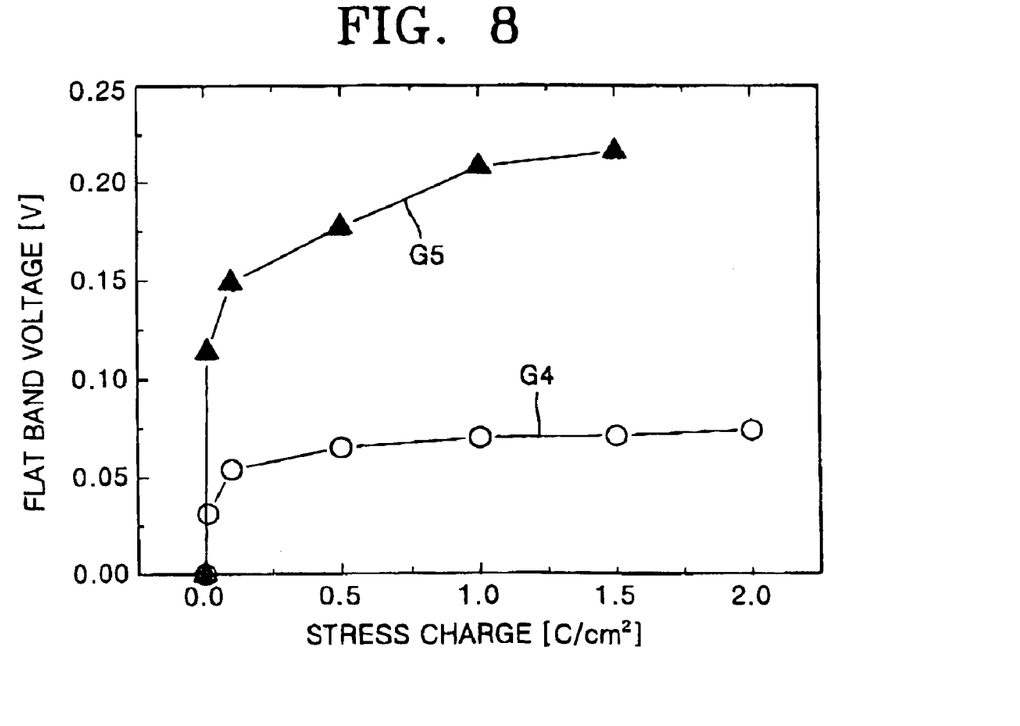
FIG. 8 is a graph showing a variation of a flat band voltage according to a stress charge, according to an embodiment of the present invention.

Next, in order to verify the effects of doping with Dy on the charge trap, the variation of the flat band voltage under an electrical stress with respect to the above two cases was measured. FIG. 8 shows these experimental results.

In FIG. 8, graph G4 with symbol "○" shows the results from the first case, and graph G5 with symbol "▲" shows the second case.

Referring to graphs G4-G5 in FIG. 8, it is seen that as the stress charge increases, that is, by increasing the concentration of Dy in the first trapping material film 44, the differences in the flat band voltage between the two cases increases drastically.

Since the flat band voltage is directly related to the trapped charge in the first trapping material film 44, this result demonstrates that the trapping density of the first trapping material film 44 is higher in the second case than that in the first case.

According to the foregoing descriptions, a nonvolatile semiconductor memory device having a trapping material film formed of an insulating film doped with a lanthanide and having a high dielectric constant in accordance with the present invention, the effective thickness of the trapping material film can be reduced. Further, the trap density of the trapping material film can be easily controlled by controlling the doping concentration. Consequently, in comparison with the conventional art, a nonvolatile semiconductor memory device according to the present invention can be operated at a lower voltage and for an extended time.

Figure 9:
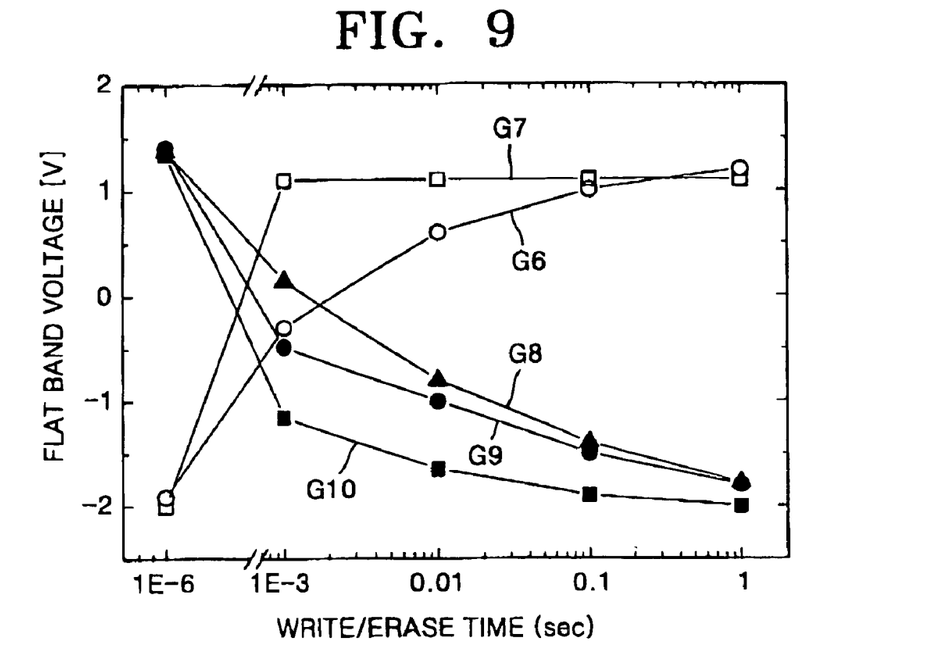
FIG. 9 is a graph showing a variation of a flat band voltage according to a write/read time, according to an embodiment of the present invention.
Figure 10:
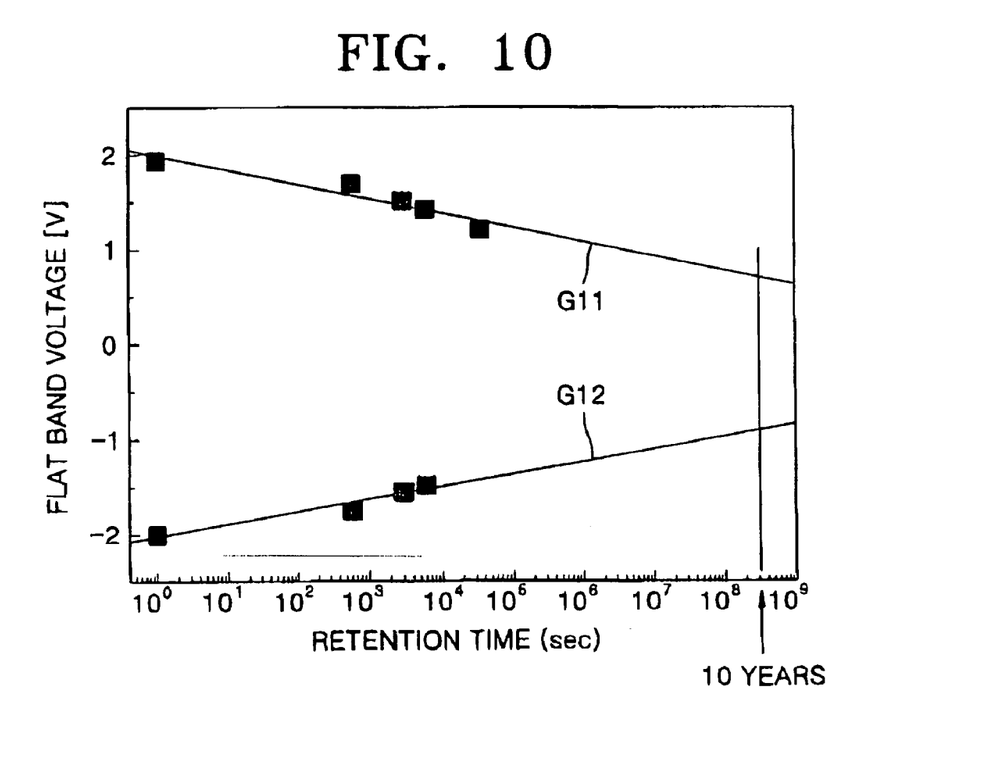
FIG. 10 is a graph showing a variation of a flat band voltage according to a retention time, according to an embodiment of the present invention.

FIG. 9 and FIG. 10 show experimental results of writing/erasing time and retention time versus the flat band voltage, respectively. In FIG. 9, graphs G6 and G7, with symbols "○" and "□," show the variation of the flat band voltage according to the applying time of voltage when applied voltages for recording data is 7 volts and 8 volts, respectively. Graphs G8 through G10, with symbols "▲", "●", and "■," show the variation of the flat band voltage according to the applying time of voltage when applied voltages for erasing data is 6 volts, 7 volts, and 8 volts, respectively.

Graphs G6 and G7 in FIG. 9 illustrate that the time to reach the desired flat band voltage is very short even when the voltage applied to the gate electrode for data writing is 8 volts, which is lower than the voltage used in the conventional art, which is typically about 10 volts. When the applied voltage to the gate electrode is 7 volts, the shift of the flat band voltage is slower than that when the applied voltage is 8 volts. However, taking into consideration that the magnitude of the flat band voltage required for identifying "1" and "0" is 0.5 volt, the time for shifting from initial value to 0.5 volt is also very short when the voltage applied to the gate electrode is 7 volts. Thus, even at a lower voltage, data writing with the present invention is faster than that of the conventional art even operating at a higher voltage.

Referring to graphs G8 through G10 in FIG. 9, in the cases that the absolute value of voltages applied to the gate electrode for data erasing are smaller (−8 volts, −7 volts, or −6 volts) than the voltages in the conventional art, it is seen that even though there are some relative differences, generally, the flat band voltage decreases drastically. This means that the speed of data erasing become faster.

Next, referring to FIG. 10, graph G11 shows the variation of the flat band voltage according to the retention time for keeping data "1" in a normal state when a predetermined gate voltage Vg (Vg=8 volts) was applied to the gate electrode 48, and a charge was trapped in the first trapping material film 44 by applying a predetermined voltage Vd to the drain region D, i.e., data "1" was recorded in the first trapping material film 44. Graph G12 shows the variation in the flat band voltage according to the retention time for keeping the data "0" when all charges in the first trapping material film 44 were removed, i.e., recorded "0" in the first trapping material film 44 by applying an erasing voltage (−8 volts) to the gate electrode 48.

For a clear distinction between recorded data of "1" and "0" after a long time, the voltage difference between the flat band voltage corresponding to the data "1" (hereinafter, a first flat band voltage) and that of corresponding to the data "0" (hereinafter, a second flat band voltage) is preferably more than a predetermined value, e.g., 0.5 volt. Referring to the graphs G11 and G12 in FIG. 10, it is seen that the voltage difference between the first and second flat band voltages at a time corresponding to 10 years after recording the data is more than 0.5 volt. That is, a nonvolatile semiconductor memory device according to the present invention is capable of operating at a lower voltage than in the conventional art. Even when operating at a lower voltage, the retention time and the data writing/erasing time of the present invention are improved compared with those in the conventional art.

Figure 11:
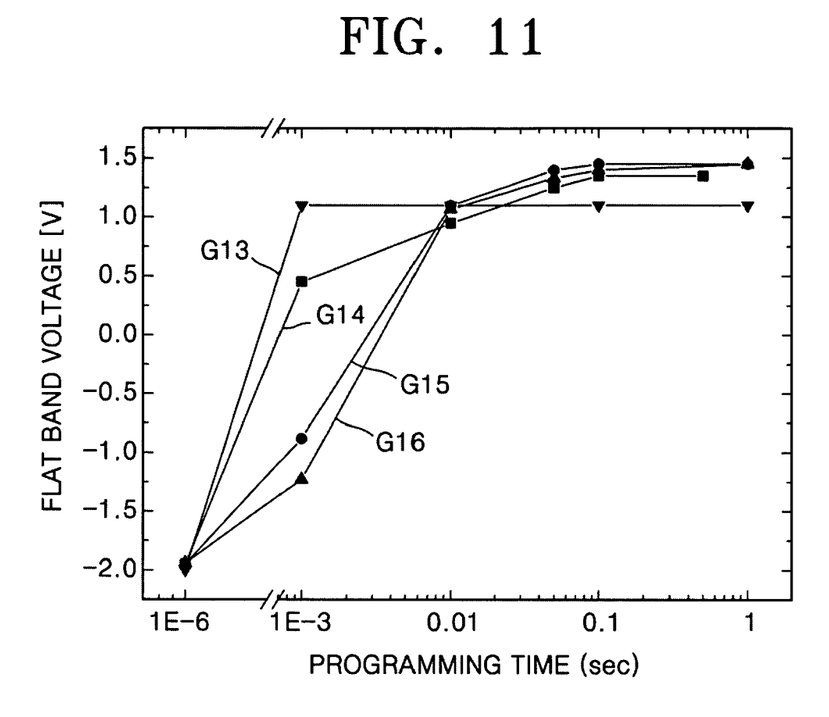
FIG. 11 is a graph showing a variation of a flat band voltage according to a programming time, according to an embodiment of the present invention.
Figure 12:
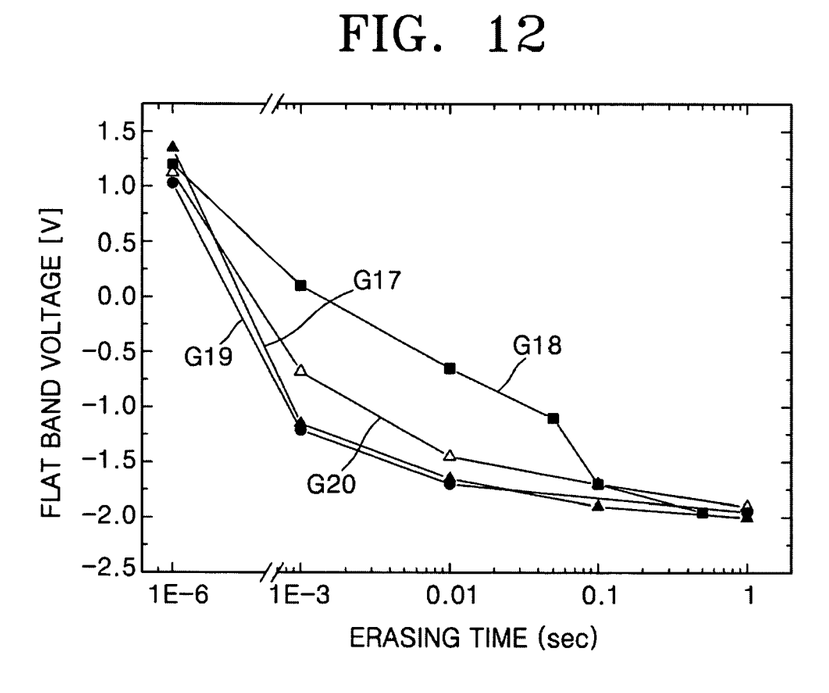
FIG. 12 is a graph showing a variation of a flat band voltage according to a erasing time, according to an embodiment of the present invention.

FIGS. 11 and 12 show the characteristics of data recording, i.e., programming characteristics, and the characteristics of data erasing, respectively, of a nonvolatile semiconductor memory device of the present invention in comparison with the characteristics of the conventional art.

In FIG. 11, graph G13 shows the variation of the flat band voltage according to the data recording time, i.e., programming time when 8 volts of data recording voltage was applied to a nonvolatile semiconductor memory device having a gate stack with an Oxide-Hafnium oxide-Aluminum oxide (OHA) film according to an embodiment of the present invention. Graph G14 shows the flat band voltage according to the programming time when 10 volts of data recording voltage was applied to a conventional nonvolatile semiconductor memory device having a gate stack with an ONO film. Graph G15 shows the flat band voltage according to the programming time when 10 volts of data recording voltage was applied to a conventional nonvolatile semiconductor memory device having a gate stack with an Oxide-Nitride-Aluminum oxide (ONA) film. Graph G16 shows the flat band voltage according to the programming time when 8 volts of data recording voltage was applied to a conventional nonvolatile semiconductor memory device having a gate stack with an ONA film.

Referring to the graphs G13 through G16 in FIG. 11, the gate stack having an OHA film (present invention) shows the shortest programming time but the largest amount of shift of the flat band voltage, in spite of having a lower operating voltage applied to the gate stack having the OHA film than applied to the gate stack having an ONO film or an ONA film (conventional art). This means that the speed of data recording in the present invention is faster at a lower voltage than the speed of data recording in the conventional art at a higher voltage.

In FIG. 12, graph G17 shows the variation of the flat band voltage according to the erasing time when an erasing voltage of −8 volts was applied to a nonvolatile semiconductor memory device having a gate stack with an OHA film according to an embodiment of the present invention. Graphs G18 and G19 show the variation of the flat band voltage according to the erasing time when an erasing voltage of −10 volts was applied to a conventional nonvolatile semiconductor memory device having a gate stack with an ONO film and an ONA film, respectively. Graph G20 shows the variation of the flat band voltage according to the erasing time when an erasing voltage of −8 volts was applied to a conventional nonvolatile semiconductor memory device having a gate stack with an ONA film.

Referring to the graphs G17 through G20 in FIG. 12, when an erasing voltage of −8 volts was applied to the gate stack having an OHA film (the present invention) and when an erasing voltage of −10 volts was applied to the gate stack having an ONA film (conventional art), the resulted erasing characteristics are similar to each other. However, considering the lower erasing voltage, the erasing characteristic of the present invention is superior to that of the conventional art. When erasing voltages of −10 volts and −8 volts were applied to the gate stack having an ONO film and an ONA film, respectively, the erasing characteristic of the conventional art is clearly inferior to that of the present invention.

Now, the characteristics of energy bands of a nonvolatile semiconductor memory device according to an embodiment of the present invention will be described.

Figure 13:
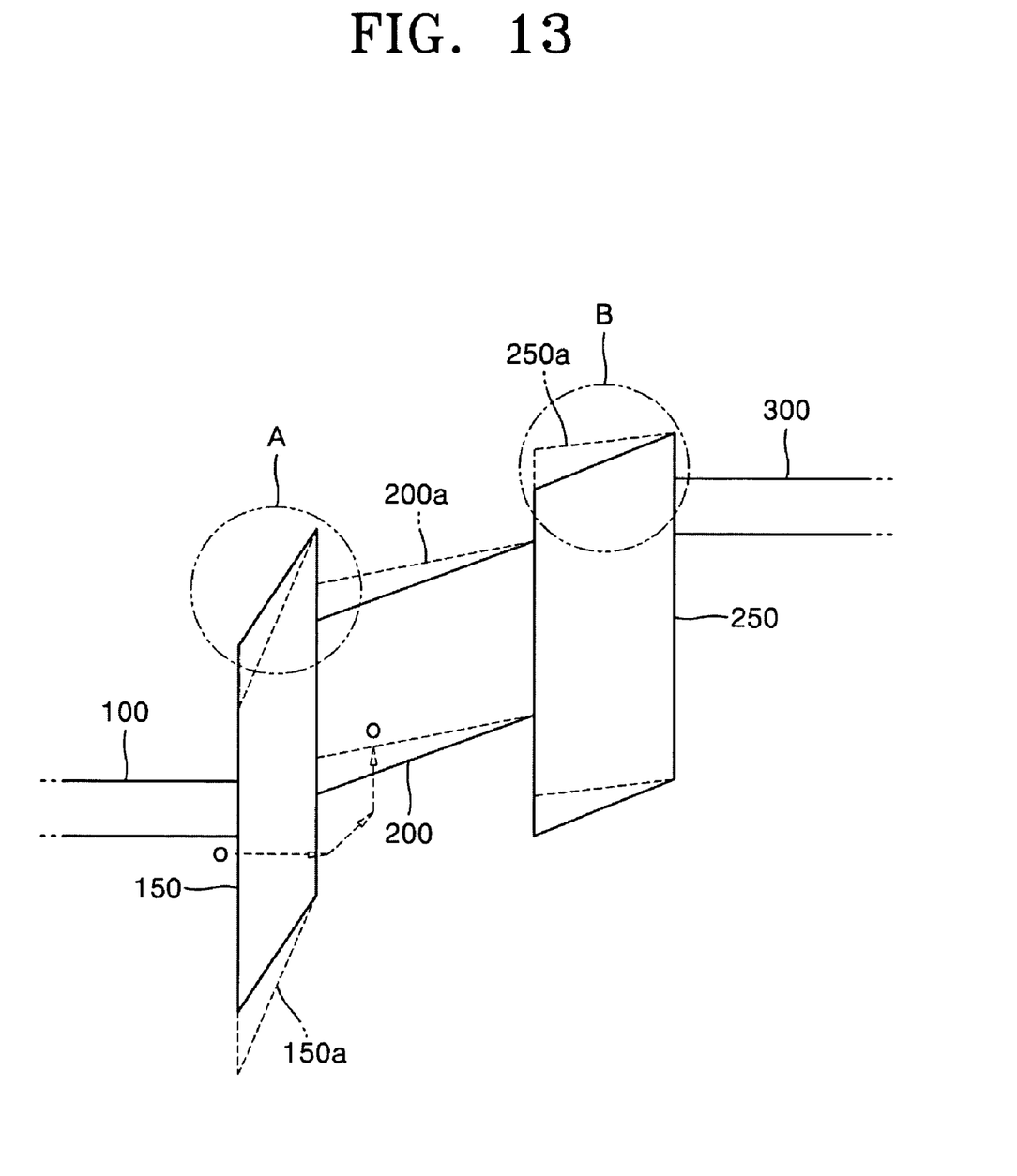
FIG. 13 is a graph showing an energy band of an OHA film according to an embodiment of the present invention and an energy band of an ONO film according to the conventional nonvolatile memory device.

FIG. 13 shows the energy band of a nonvolatile semiconductor memory device having a gate stack according to the present invention, and for comparison purposes, that of a nonvolatile semiconductor memory device having a gate stack with an ONO film according to the conventional art.

Reference numerals 100 and 300 indicate the energy bands of a semiconductor substrate and a gate electrode, respectively, and numerals 150, 200, and 250 indicate the energy bands of an ONO film, i.e., a lower silicon oxide film, a nitride film, and an upper silicon oxide film deposited sequentially between the semiconductor substrate and the gate electrode of the conventional art, respectively. Reference numerals 150A, 200A, and 250A indicate the energy bands of an OHA film deposited sequentially between the semiconductor substrate and the gate electrode according to an embodiment of the present invention.

Referring to a circle A indicated in FIG. 13, the slope of the energy band 150A of the tunneling oxide film, i.e., the silicon oxide film according to the present invention, is steeper than the slope of the energy band 150 of the lower silicon oxide film of the conventional art. Accordingly, the tunneling speed of electrons through the silicon oxide film of the present invention is faster than that of the conventional art, thereby increasing the programming speed.

At the same thickness of a silicon oxide film of the conventional art and the corresponding film, i.e., the tunneling oxide film of the present invention, as in foregoing descriptions, the speed of the electrons passing through the tunneling oxide film according to the present invention is faster than that of the conventional art. Therefore, the tunneling oxide film of the present invention can be made thicker than that of the lower silicon oxide film of the conventional art while not reducing the speed of electrons. Thus, the possibility that electrons trapped in the trapping material film leak can be reduced, thereby resulting in a superior retention characteristic of the present invention relative to the retention characteristic of the conventional art.

Alternatively, referring to circle B in FIG. 13, it is seen that the slope of the energy band 250 of the upper silicon oxide film of the conventional art is steeper than the slope of the energy band 250A of the aluminum oxide film, which corresponds to the upper silicon oxide film of the present invention. Accordingly, the back tunneling is reduced, and the erasing speed is faster in the present invention than in the conventional art.

In addition, comparing the energy band 200 of a nitride film where the charge is trapped of the conventional art with the energy band 200A of a trapping material film of the present invention, i.e., a hafnium oxide film which corresponds to the nitride film of the conventional art, the slope of the energy band 200 of the nitride film of the conventional art is steeper than the slope of the energy band 200A of the hafnium oxide film of the present invention. Accordingly, the trap density of the trapping material film according to the present invention is increased as compared to that of the nitride film of the conventional art, thereby increasing both the programming speed and erasing speed in comparison with the conventional art.

The following table summarizes the measurement results of the applied voltage distribution and the strength of electric field of a nonvolatile semiconductor memory device having an ONO film in the conventional art and having an OHA film. The thicknesses of the various layers in both films is the same and the same voltage, i.e., 10 volts, is applied to each film.

TABLE

| Film | Thickness (nm) | Voltage distribution (V) | Strength of electric field (MV/cm) |
| --- | --- | --- | --- |
| ONO | 1.8/6.0/4.5 | 1.91/3.31/4.78 | 10.62/5.52/10.62 |
| OHA | 1.8/6.0/4.5 | 3.81/2.48/3.71 | 21.16/4.13/8.25 |

Referring to the above table, it can be seen that the induced strength of an electric field of the lower silicon oxide film of the ONO film of the conventional art and that of the corresponding film, i.e., the tunneling oxide film of the OHA film of the present invention, is different. More specifically, the induced strength of the electric field of the lower silicon oxide film (hereinafter, a first strength of the electric field) of the conventional art is 10.62 MV/cm, while that of the tunneling oxide film (hereinafter, a second strength of electric field) of the present invention is 21.16 MV/cm. Thus, the second strength of electric field is more than double the first strength of electric field. Also, the induced strength of electric field of the upper silicon oxide film (hereinafter, a third strength of electric field) of the conventional art is 10.62 MV/cm, while the induced strength of electric field of the aluminum oxide film (hereinafter, a fourth strength of electric field) of the present invention is 8.25 MV/cm, i.e., the fourth strength of electric field is smaller than the third strength of electric field. Since the second strength of electric field is much larger than the first strength of electric field as depicted in FIG. 13, the slope of the energy band 150A of the tunneling oxide film in the present invention becomes larger than that of the energy band 150 of the oxide film of the conventional art. Accordingly, the tunneling of electrons through the oxide film of the present invention is much faster than that of the conventional art. Also, since the fourth strength of electric field is smaller than the third strength of electric field as depicted in FIG. 13, the slope of the energy band 250A of aluminum oxide film of the present invention become smaller than that of the energy band 250 of the upper silicon oxide film of the conventional art, therefore, as in the foregoing description, the back tunneling in the aluminum oxide film of the present invention takes place less than in the upper silicon oxide film of the conventional art.

The above results are natural in view of the dielectric constant distribution of the ONO film of the conventional art and that of the OHA film of the present invention. That is, the dielectric constant $\in$ is inversely proportional to the applied voltage V to an ONO film or an OHA film, and can be expressed as follows:

$$V = (Q \times t)/(\in \times \text{Area})$$

where V is a voltage applied to the ONO or OHA films, Q is the amount of charge, t is a thickness of the ONO or OHA films, $\in$ is a dielectric constant of the ONO or OHA films, and Area is the area of the gate electrode facing the substrate.

In the OHA film of the present invention, the tunneling oxide film has the lowest dielectric constant of the three layers. A dielectric constant $\in$(trap) of the trapping material film, here the hafnium oxide film, is much higher than a dielectric constant $\in$(tunnel) of the tunneling oxide film and a dielectric constant $\in$(alum) of the aluminum oxide film. Also, the dielectric constant $\in$(alum) of the aluminum oxide film is higher than that of the tunneling oxide film. That is, $\in$(trap)>$\in$(alum)>$\in$(tunnel). Therefore, when a predetermined voltage is applied to the OHA film, the largest voltage is induced in the tunneling oxide film, the next largest voltage is induced in the aluminum oxide film, and the lowest voltage is induced in the hafnium oxide film. Under this circumstance, the induced strength of electric field of the tunneling oxide film becomes the greatest because the tunneling oxide film has the thinnest thickness (1.8 nm), the induced strength of electric field of the aluminum oxide film is second because it has medium thickness (4.5 nm), and the induced strength of electric field of the hafnium oxide film is lowest because it has the thickest thickness (6 nm).

In the case of the ONO film of the conventional art, each film has a different induced voltage according to the dielectric constant of each film. The induced voltage become larger in the order from the lower silicon oxide film, nitride film, and the upper silicon oxide film, however, considering the thickness of each film, the induced strength of electric field of the lower silicon oxide film becomes equivalent to that of the upper silicon oxide film, and the nitride film has the lowest strength of electric field. However, in the ONO film of the conventional art, unlike the OHA film of the present invention, the dielectric constant difference between the films are not that great. For this reason, the induced voltage of the lower silicon oxide film of the conventional art is 1.91 volts, while, the induced voltage of the tunneling oxide film of the present invention is 3.81 volts which is about two times larger than that of the conventional art. Considering that the lower silicon oxide film of the conventional art has the same thickness as the tunneling oxide film of the present invention, which is 1.8 nm, the difference in the induced strength of electric field between the two films is doubled as shown in the table above.

Next, the operations of the nonvolatile semiconductor memory device having the above characteristics according to the first embodiment of the present invention will be described with reference to FIG. 2.

Write

When a writing voltage Vg is applied to the gate electrode 48, a predetermined voltage Vd is applied to the drain region D. In this process, charges, i.e., electrons, are trapped in the first trapping material film 44, and the amount of shift of the flat band voltage is determined according to the amount of trapped electrons.

Read

When a reading voltage Vg' is applied to the gate electrode 48, a predetermined voltage Vd' is also applied to the drain region D. In this process, it is assumed that data "1" is read when the current flow between a source S and a drain region D is greater than a reference current, e.g., 1 μA, and it is assumed that the data "0" is read when the current flow is less than the reference current.

Next, a method of manufacturing a nonvolatile semiconductor memory device according to the first embodiment of the present invention will be described.

More specifically, the tunneling oxide film 42, the first trapping material film 44, the first insulating film 46, and the gate electrode 48 are sequentially deposited on the substrate 40. The tunneling oxide film 42 may be formed of a silicon oxide film and may have a thickness of approximately 2~4 nm. The first trapping material film 44 where the data are stored may be formed of a material film doped with a lanthanide at a doping concentration of approximately 1~20%, e.g., 10%, and having at least a higher dielectric constant than a nitride film, i.e., around 7.5. Such material films include, for example, an oxide film having a high dielectric constant selected from the group consisting of $HfO_2$, $ZrO_2$, $Ta_2O_5$, $TiO_2$, and $Al_2O_3$. When the first trapping material film 44 is formed of $HfO_2$ film, the thickness may be approximately 2~15 nm. The first trapping material film 44 may be formed using atomic layer deposition (ALD), sputtering, or chemical vapor deposition (CVD). The lanthanide may be selected from the group consisting of La, Ce, Pr, Nd, Sm, Eu, Gd, Tb, Dy, Ho, Er, Tm, Yb, and Lu.

The first insulating film 46 may be formed of a material having a relatively large band gap, and having at least a higher dielectric constant than a nitride film, such as aluminum oxide film. The aluminum oxide film may also be formed using ALD.

When a second oxide film 52 is formed between the first trapping material film 44 and the first insulating film 46 as depicted in FIG. 3, the second oxide film may be formed of an aluminum oxide film, and the first insulating film 46 may be formed of a film selected from the group consisting of $HfO_2$, $ZrO_2$, $Ta_2O_5$, and $TiO_2$. The thickness of the second oxide film 52 may be approximately 0.5~2 nm, and that of the first insulating film 46 may be approximately 3~20 nm.

Next, a photosensitive film pattern (not shown) defining the gate stack is formed on the gate electrode 48, as depicted in FIG. 2. The films from the gate electrode 48 to the tunneling oxide film 42 are etched sequentially using the photosensitive film pattern as a etch mask. Above etching is continued until the substrate 40 is exposed, and after completing the etching, the photosensitive film pattern is removed. Then, a gate stack is formed by sequentially depositing the tunneling oxide film 44, the first trapping material film 44, the first insulating film 46, and the gate electrode 48 on a predetermined region of a substrate, as depicted in FIG. 2. Afterward, a conductive impurity doped on the semiconductor substrate 40, e.g., an N-type impurity, which is opposite to a P-type conductive impurity, is doped by ion implantation with a predetermined depth on the entire surface of the semiconductor substrate where the gate stack is formed. Then, a source region S and drain region D are formed by a predetermined heat treatment so that one end of the gate stack contacts the source region and another end of the gate stack contacts the drain region.

The method of manufacturing a nonvolatile semiconductor memory device according to the second through fourth embodiments of the present invention, as depicted in FIGS. 3 through 5, respectively, includes the following additional steps. In addition to the steps for manufacturing the first embodiment, the second embodiment includes forming the first and second oxide films 50 and 52 are formed on and under the first trapping material film 44 according to the first embodiment of the present invention. In addition to the steps for manufacturing the second embodiment, the third embodiment includes forming a second trapping material film 54 and a second insulating film 56 between the first insulating film 46 and the gate electrode 48. In addition to the steps for manufacturing the third embodiment, the fourth embodiment includes forming oxide films on and under the first and second trapping material films 44 and 54. The method of forming the additional films has already been described in detail in the second through fourth embodiments of the present invention.

According to the foregoing descriptions, a nonvolatile semiconductor memory device according to an embodiment of the present invention provides an OHA film having a distribution of dielectric constant unlike that of the ONO film between a gate electrode and a substrate. In the OHA film, the "O" represents a tunneling oxide film, "H" represents a hafnium film used as a trapping material film, which corresponds to the nitride film in the ONO film, and "A" represents an aluminum oxide film used as a barrier film, which corresponds to the upper silicon oxide film in the ONO film. The induced strength of electric field of the tunneling oxide film in the OHA film is much greater than the lower silicon oxide film in the ONO film. Therefore, the tunneling speed of the charge in the tunneling oxide film in the OHA film is much faster than in the lower silicon oxide film of the conventional art. Accordingly, the operation speed of a memory device having OHA film is much faster than that of the ONO film of the conventional art.

In the case of the present invention, since the tunneling speed of the charges is faster than the speed in the conventional art, the thickness of the tunneling oxide film can be formed thicker than that of the lower silicon oxide film in the ONO film of the conventional art under the condition that the tunneling speed of the charge is maintained as fast as in the OHA film. Accordingly, a nonvolatile semiconductor memory device according to the present invention has a much improved retention characteristics.

In addition, in the OHA film of the present invention, since the trapping material film is doped with a lanthanide at a predetermined concentration, the trap site density of the trapping material film in the OHA film becomes much greater. Therefore, the operation voltage of a nonvolatile semiconductor memory device according to the present invention becomes lower than that voltage of the conventional art.

While the present invention has been particularly shown and described with reference to embodiments thereof, it should not be construed as being limited to the embodiments set forth herein but as an exemplary. This invention may, however, be embodied in many different forms by those skilled in this art. For example, in the third and the fourth embodiments, the first trapping material film is a film doped with Dy, but the second trapping material film could be a nitride film. Also, an insulating material having a high dielectric constant other than the one described above can be used as the trapping material film. Accordingly, since the present invention can be made in many different forms, the scope of the present invention shall be defined by the sprit of technical thought with reference to the appended claims not by the embodiments set forth herein.

What is claimed is:

1. A nonvolatile semiconductor memory device, comprising:
   a semiconductor substrate having a source region and a drain region separated by a predetermined distance; and
   a gate stack formed on the semiconductor substrate, one end of the gate stack contacting the source region and another end of the gate stack contacting the drain region, wherein the gate stack includes, in sequential order from the substrate,
   a tunneling film,
   a first trapping material film doped with a first predetermined impurity, the first trapping material film having a higher dielectric constant than a nitride film ($Si_3N_4$);
   a first insulating film having a higher dielectric constant than the nitride film,
   a gate electrode, and
   at least one of a first oxide film between the tunneling film and the first trapping material film, and a second oxide film between the first trapping material film and the first insulating film.

2. The nonvolatile semiconductor memory device as claimed in claim 1, wherein at least one of the first oxide film and the second oxide film is an aluminum oxide ($Al_2O_3$) film.

3. The nonvolatile semiconductor memory device as claimed in claim 1, wherein the first insulating film is an aluminum oxide ($Al_2O_3$) film.

4. The nonvolatile semiconductor memory device of claim 2, wherein the first insulating film is a film selected from the group consisting of $HfO_2$ film, $ZrO_2$ film, $Ta_2O_5$ film, and $TiO_2$ film.

5. The nonvolatile semiconductor memory device as claimed in claim 4, wherein the first trapping material film includes $HfO_2$.

6. The nonvolatile semiconductor memory device as claimed in claim 5, wherein the first predetermined impurity is Dy.

7. The nonvolatile semiconductor memory device as claimed in claim 6, further comprising:
a second trapping material film doped with a second predetermined impurity, the second trapping material film having a higher dielectric constant than the nitride film; and
a second insulating film having a higher dielectric constant than the nitride film, the second trapping material film and the second insulating film being sequentially formed between the first insulating film and the gate electrode.

8. A nonvolatile semiconductor memory device, comprising:
a semiconductor substrate having a source region and a drain region separated by a predetermined distance; and
a gate stack formed on the semiconductor substrate, one end of the gate stack contacting the source region and another end of the gate stack contacting the drain region, wherein the gate stack includes, in sequential order from the substrate,
a tunneling film,
a first trapping material film doped with a first predetermined impurity, the first trapping material film having a higher dielectric constant than a nitride film ($Si_3N_4$),
a first insulating film having a higher dielectric constant than the nitride film, and
a gate electrode, wherein the first predetermined impurity is a lanthanide.

9. The nonvolatile semiconductor memory device as claimed in claim 8, wherein a doping concentration of the lanthanide is approximately 1~20%.

10. The nonvolatile semiconductor memory device as claimed in claim 9, wherein the first predetermined impurity is Dy.

11. The nonvolatile semiconductor memory device as claimed in claim 10, wherein the first trapping material film includes $HfO_2$.

12. The nonvolatile semiconductor memory device as claimed in claim 11, further comprising:
a second trapping material film doped with a second predetermined impurity, the second trapping material film having a higher dielectric constant than the nitride film; and
a second insulating film having a higher dielectric constant than the nitride film, the second trapping material film and the second insulating film being sequentially formed between the first insulating film and the gate electrode.

13. A nonvolatile semiconductor memory device, comprising:
a semiconductor substrate having a source region and a drain region separated by a predetermined distance; and
a gate stack formed on the semiconductor substrate, one end of the gate stack contacting the source region and another end of the gate stack contacting the drain region, wherein the gate stack includes, in sequential order from the substrate,
a tunneling film,
a first trapping material film doped with a first predetermined impurity, the first trapping material film having a higher dielectric constant than a nitride film ($Si_3N_4$), and the first trapping material film is a film selected from at least one of $HfO_2$, $ZrO_2$, $Ta_2O_5$, $Al_2O_3$,
a first insulating film having a higher dielectric constant than the nitride film,
a gate electrode, and
at least one of a first oxide film between the tunneling film and the first trapping material film, and a second oxide film between the first trapping material film and the first insulating film.

14. The nonvolatile semiconductor memory device as claimed in claim 13, wherein the first predetermined impurity is Dy.

15. The nonvolatile semiconductor memory device as claimed in claim 14, further comprising:
a second trapping material film doped with a second predetermined impurity, the second trapping material film having a higher dielectric constant than the nitride film; and
a second insulating film having a higher dielectric constant than the nitride film, the second trapping material film and the second insulating film being sequentially formed between the first insulating film and the gate electrode.

16. A nonvolatile semiconductor memory device, comprising:
a semiconductor substrate having a source region and a drain region separated by a predetermined distance; and
a gate stack formed on the semiconductor substrate, one end of the gate stack contacting the source region and another end of the gate stack contacting the drain region, wherein the gate stack includes, in sequential order from the substrate,
a tunneling film,
a first trapping material film doped with a first predetermined impurity, the first trapping material film having a higher dielectric constant than a nitride film ($Si_3N_4$);
a first insulating film having a higher dielectric constant than the nitride film,
a gate electrode,
a second trapping material film doped with a second predetermined impurity, the second trapping material film having a higher dielectric constant than the nitride film; and
a second insulating film having a higher dielectric constant than the nitride film, the second trapping material film and the second insulating film being sequentially formed between the first insulating film and the gate electrode.

17. The nonvolatile semiconductor memory device as claimed in claim 16, wherein the second trapping material film is formed of a material selected from the group consisting of $HfO_2$, $ZrO_2$, $Ta_2O_5$, $TiO_2$, and $Al_2O_3$.

18. The nonvolatile semiconductor memory device as claimed in claim of 16, wherein the second insulating film is a film selected from the group consisting of $HfO_2$ film, $ZrO_2$ film, $Ta_2O_5$ film, $TiO_2$ film, and $Al_2O_3$ film.

19. The nonvolatile semiconductor memory device as claimed in claim 16, wherein the first insulating film is a film selected from the group consisting of $HfO_2$ film, $ZrO_2$ film, $Ta_2O_5$ film, and $TiO_2$ film.

20. The nonvolatile semiconductor memory device as claimed in claim 16, further comprising at least one of a first oxide film between the tunneling film and the first trapping material film, a second oxide film between the first trapping material film and the first insulating film, a third oxide film between the first insulating film and the second trapping material film, and a fourth oxide film between the second trapping material film and the second insulating film.

21. The nonvolatile semiconductor memory device as claimed in claim 20, wherein at least one of the first oxide film, the second oxide film, the third oxide film and the fourth oxide film is an aluminum oxide film.

22. The nonvolatile semiconductor memory device as claimed in claim 16, further comprising at least two of a first oxide film between the tunneling film and the first trapping material film, a second oxide film between the first trapping material film and the first insulating film, a third oxide film between the first insulating film and the second trapping material film, and a fourth oxide film between the second trapping material film and the second insulating film.

23. The nonvolatile semiconductor memory device as claimed in claim 22, wherein at least one of the first oxide film, the second oxide film, the third oxide film and the fourth oxide film is an aluminum oxide film.

24. The nonvolatile semiconductor memory device as claimed in claim 16, further comprising at least three of a first oxide film between the tunneling film and the first trapping material film, a second oxide film between the first trapping material film and the first insulating film, a third oxide film between the first insulating film and the second trapping material film, and a fourth oxide film between the second trapping material film and the second insulating film.

25. The nonvolatile semiconductor memory device as claimed in claim 24, wherein at least one of the first oxide film, the second oxide film, the third oxide film and the fourth oxide film is an aluminum oxide film.

26. The nonvolatile semiconductor memory device as claimed in claim 16, further comprising a first oxide film between the tunneling film and the first trapping material film, a second oxide film between the first trapping material film and the first insulating film, a third oxide film between the first insulating film and the second trapping material film, and a fourth oxide film between the second trapping material film and the second insulating film.

27. The nonvolatile semiconductor memory device as claimed in claim 26, wherein at least one of the first oxide film, the second oxide film, the third oxide film and the fourth oxide film is an aluminum oxide film.

28. The nonvolatile semiconductor memory device as claimed in claim 16, wherein the first predetermined impurity is a lanthanide.

29. The nonvolatile semiconductor memory device as claimed in claim 28, wherein a doping concentration of the lanthanide is approximately 1~20%.

30. The nonvolatile semiconductor memory device as claimed in claim 16, wherein the second predetermined impurity is a lanthanide.

31. The nonvolatile semiconductor memory device as claimed in claim 30, wherein a doping concentration of the lanthanide is approximately 1~20%.

32. The nonvolatile semiconductor memory device as claimed in claim 16, wherein the first trapping material film includes $HfO_2$.

33. The nonvolatile semiconductor memory device as claimed in claim 32, wherein the first predetermined impurity is Dy.

34. The nonvolatile semiconductor memory device as claimed in claim 33, further comprising at least one of a first oxide film between the tunneling film and the first trapping material film, and a second oxide film between the first trapping material film and the first insulating film.

* * * * *